US010271522B2

(12) United States Patent
Chen

(10) Patent No.: US 10,271,522 B2
(45) Date of Patent: *Apr. 30, 2019

(54) PET CHEST STRAP WITH MOUNT

(71) Applicant: Dongguan Jiasheng Enterprise Co., Ltd., Dongguan (CN)

(72) Inventor: Silong Chen, Dongguan (CN)

(73) Assignee: Dongguan Jiasheng Enterprise Co., Ltd., Dongguan (CN)

( * ) Notice: Subject to any disclaimer, the term of this patent is extended or adjusted under 35 U.S.C. 154(b) by 11 days.

This patent is subject to a terminal disclaimer.

(21) Appl. No.: 15/695,453

(22) Filed: Sep. 5, 2017

(65) Prior Publication Data

US 2018/0343835 A1 Dec. 6, 2018

(30) Foreign Application Priority Data

Jun. 6, 2017 (CN) .......................... 2017 1 0418716

(51) Int. Cl.
A01K 27/00 (2006.01)
H05K 1/18 (2006.01)

(52) U.S. Cl.
CPC .......... *A01K 27/006* (2013.01); *A01K 27/002* (2013.01); *A01K 27/009* (2013.01); *H05K 1/189* (2013.01); *H05K 2201/10106* (2013.01); *H05K 2201/10537* (2013.01)

(58) Field of Classification Search
CPC .. A01K 11/008; A01K 11/006; A01K 27/001; A01K 27/002; A01K 27/006
See application file for complete search history.

(56) References Cited

U.S. PATENT DOCUMENTS

| 7,705,736 | B1* | 4/2010 | Kedziora | A01K 11/008 340/573.3 |
|---|---|---|---|---|
| 2014/0331942 | A1* | 11/2014 | Sarazyn | A01K 29/005 119/719 |
| 2015/0342149 | A1* | 12/2015 | Lutz | A01K 27/006 119/859 |
| 2017/0135315 | A1* | 5/2017 | Marmen | A01K 15/021 |
| 2017/0215386 | A1* | 8/2017 | Pianelli | A01K 27/006 |
| 2017/0265432 | A1* | 9/2017 | Anderton | G01S 5/02 |
| 2017/0372580 | A1* | 12/2017 | Vivathana | G08B 21/0261 |
| 2018/0064068 | A1* | 3/2018 | McKee | A01K 27/009 |
| 2018/0110205 | A1* | 4/2018 | Czarnecky | A01K 15/021 |
| 2018/0132450 | A1* | 5/2018 | Goetzl | A01K 27/009 |

(Continued)

*Primary Examiner* — Trinh T Nguyen
(74) *Attorney, Agent, or Firm* — Wang Law Firm, Inc.

(57) ABSTRACT

A pet chest strap with a mount includes a chest strap body and a hardware holder fixed and locked to the chest strap body. The hardware holder has a locking assembly and a connecting terminal child-and-mother seat; the chest strap body includes a flexible printed circuit component with plural LED luminous bodies attached onto the flexible printed circuit component and packaged with a resin; the LED luminous bodies are connected to the connecting terminal child-and-mother seat of the hardware holder through the flexible printed circuit component. The invention has the features of powerful function, simple structure, and reasonable design and uses a hardware holder to achieve the effect of combining different hardware components to improve the environmental adaptability of the product, so as to meet the using requirements for different occasions and environments.

1 Claim, 4 Drawing Sheets

(56) References Cited

U.S. PATENT DOCUMENTS

2018/0153137 A1* 6/2018 Goetzl ................ A01K 15/022
2018/0153138 A1* 6/2018 Goetzl ................ A01K 15/022
2018/0303068 A1* 10/2018 Chen ................... A01K 27/002

* cited by examiner

PET CHEST STRAP WITH MOUNT

FIELD OF INVENTION

The present invention relates to a pet chest strap, in particular to the pet chest strap with a mount capable of installing a smart device.

BACKGROUND OF INVENTION

1. Description of the Related Art

In general, a pet chest strap is a device used for protecting, controlling, and guiding a pet, and its consumption is very large. Compared with a pet collar, the pet chest strap with a large fixing area and a good fixing effect are used by an increasing number of users. Present pet chest straps just have simple functions and structure and no longer can meet the requirements of practical use. Specifically, relevant data indicated that more than six-million pets (including cats and dogs) were killed in car accidents last years in the United States, and most of the accidents occurred in the dark environment or the condition of insufficient light. In addition, numerous pets were missing or lost in various situations every years, and the chance of finding or getting back these missing or lost pets is very low due to lack of effective pet activity range controls and lost pet recovering measures. With the large area and good fixation, the pet chest strap is very suitable to be used as a basic carrier of a smart device, but manufacturers of the related industry still have no pet chest strap product that can be installed to a smart device yet.

2. Summary of the Invention

Therefore, it is a primary objective of the present invention to overcome the aforementioned deficiency of the prior art by providing a pet chest strap with a mount in accordance with the present invention.

To achieve the aforementioned and other objectives, the present invention provides a pet chest strap with a mount comprising a chest strap body and a hardware holder, wherein the hardware holder is fixed and locked to the chest strap body; the hardware holder has a locking assembly disposed thereon and a connecting terminal child-and-mother seat disposed therein; the chest strap body includes a flexible printed circuit component; the flexible printed circuit component has a plurality of LED luminous bodies attached thereon and packaged by a resin; the LED luminous bodies are coupled to the connecting terminal child-and-mother seat of the hardware holder through the flexible printed circuit component; the flexible printed circuit component includes a U-shaped flexible substrate, and a flexible n-shaped antenna, and the U-shaped flexible substrate and the flexible n-shaped antenna are coupled altogether, and the U-shaped flexible substrate has a round hole formed at a U-shaped bending position, and the round hole is used as the center for attaching a ring shaped structural reinforcing plate made of a hard material, and installing an LED positive electrode circuit contact, an LED negative electrode circuit contact, an antenna contact, and a grounding contact around the round hole by using the round hole as the center; the electrically conductive metal layer is comprised of a plurality of non-contact sections, and one of the sections is coupled to the LED positive electrode circuit contact, and one of the sections is coupled to the LED negative electrode contact, and one of the sections is coupled to the n-shaped antenna and antenna contact, and one of the sections is coupled to the grounding contact.

Further, hardware holder has a honeycomb reinforced structure disposed at the bottom of the hardware holder.

Further, the LED luminous body is a monochromatic lamp bead or a multi-color lamp bead.

Further, the ring shaped structural reinforcing plate has a mating hole formed thereon and provided for connection.

Further, the flexible printed circuit component has a structural reinforcing plate installed at the position of the LED luminous body and the backside of the connecting position of the U-shaped flexible substrate and the flexible n-shaped antenna, and the structural reinforcing plate is provided for preventing the LED luminous body, the n-shaped antenna, and U-shaped flexible substrate from falling out or being separated with respect to each other when the flexible printed circuit component is bent or deformed by an external force.

The present invention has the features of powerful function, simple structure, and reasonable design and uses a hardware holder to achieve the effect of combining different hardware components to improve the environmental adaptability of the product, so as to meet the using requirements for different occasions and environments.

DESCRIPTION OF THE PREFERRED EMBODIMENTS

The above and other objects, features and advantages of this disclosure will become apparent from the following detailed description taken with the accompanying drawings.

Figure 1:
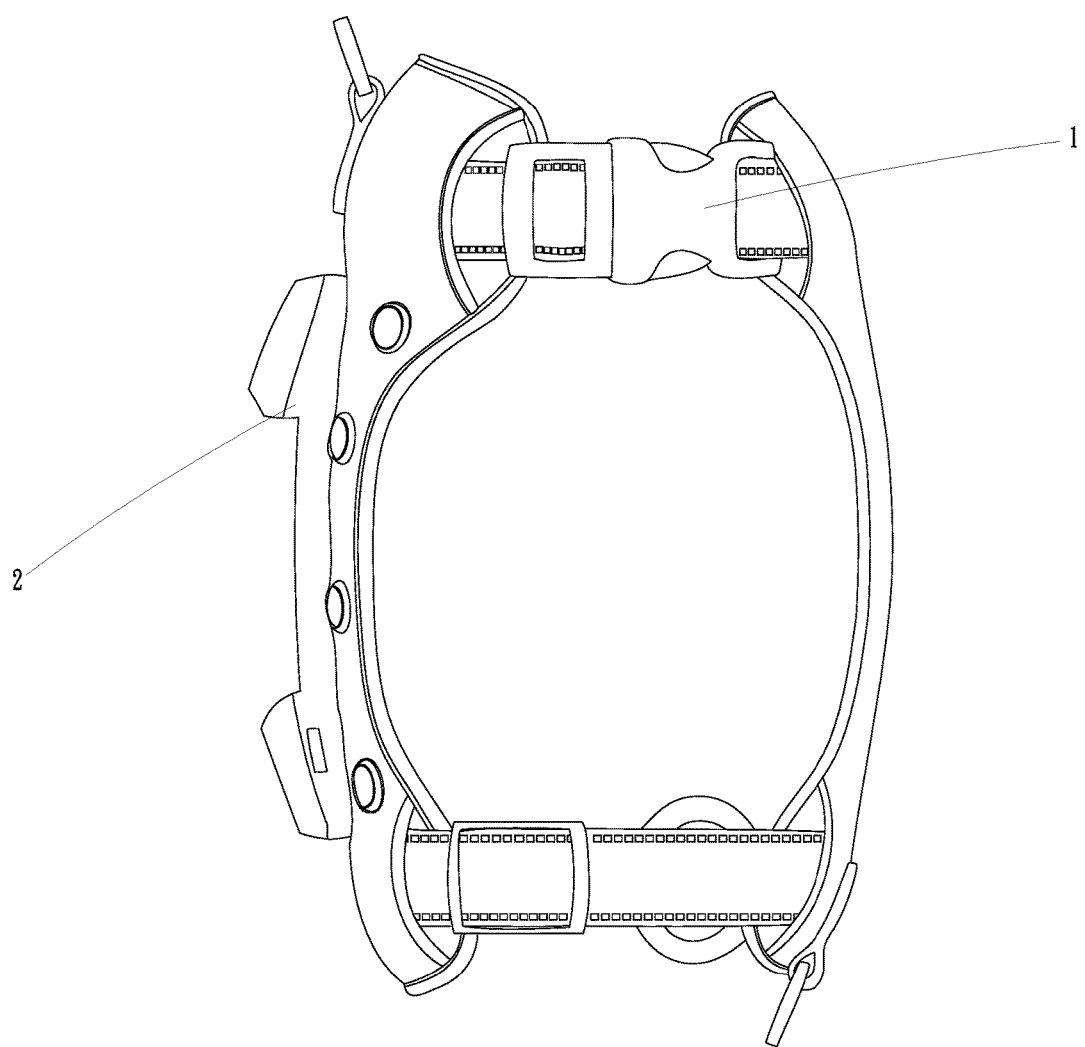
FIG. 1 is a schematic view of a pet chest strap with a mount in accordance with a preferred embodiment of the present invention.
Figure 2:
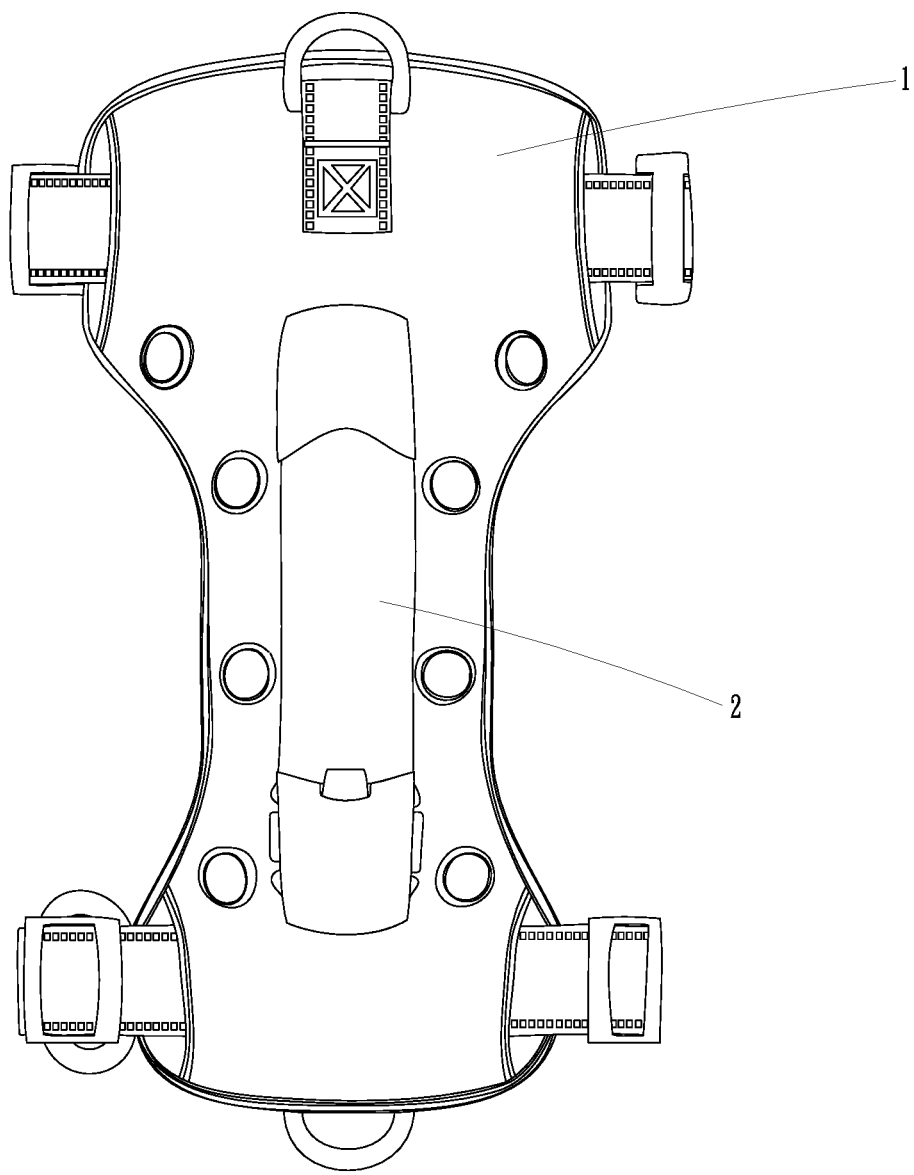
FIG. 2 is another schematic view of a pet chest strap with a mount in accordance with a preferred embodiment of the present invention.
Figure 3:
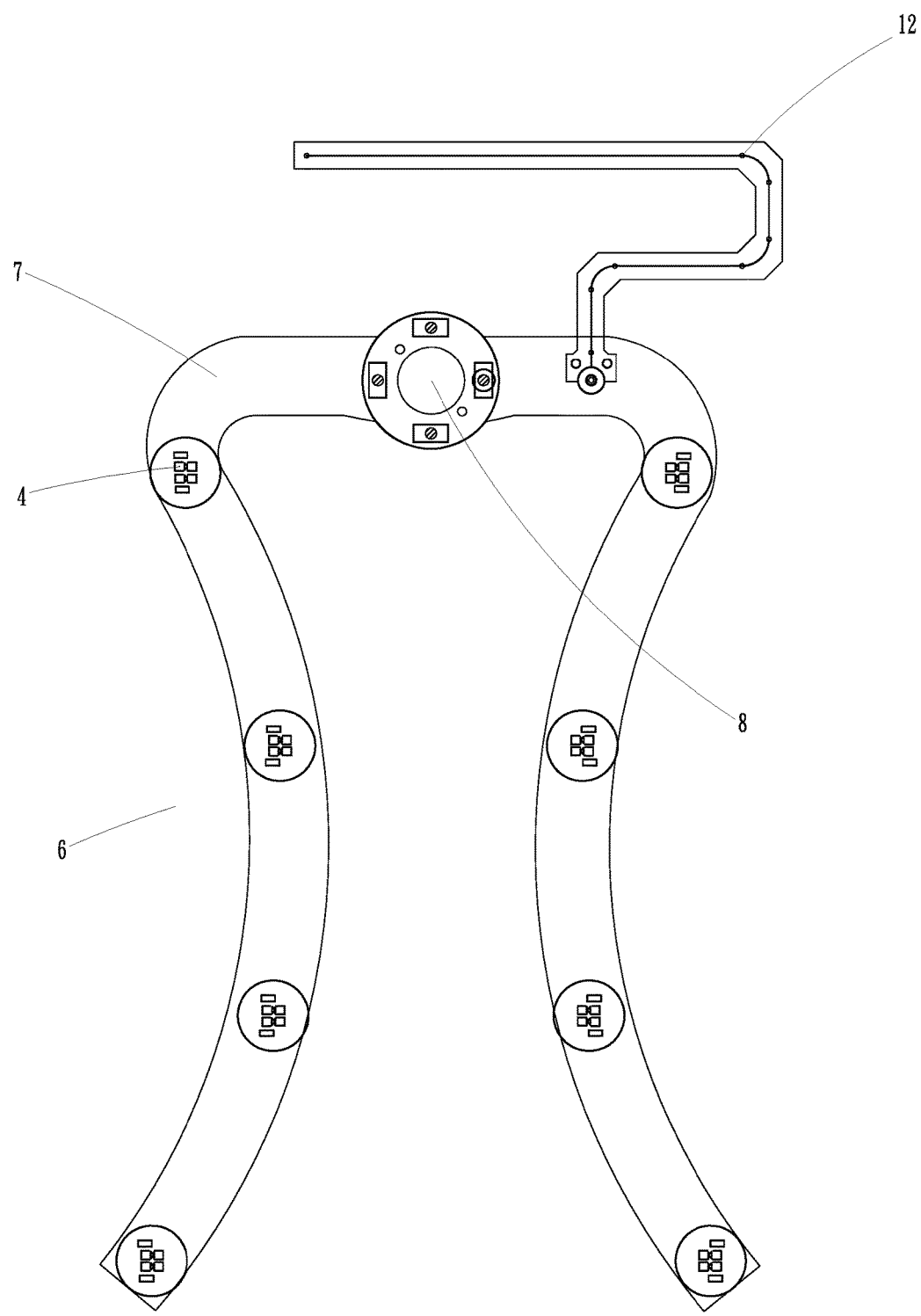
FIG. 3 is a schematic view of a flexible printed circuit component and an LED luminous body assembled with each other in accordance with the present invention.
Figure 4:
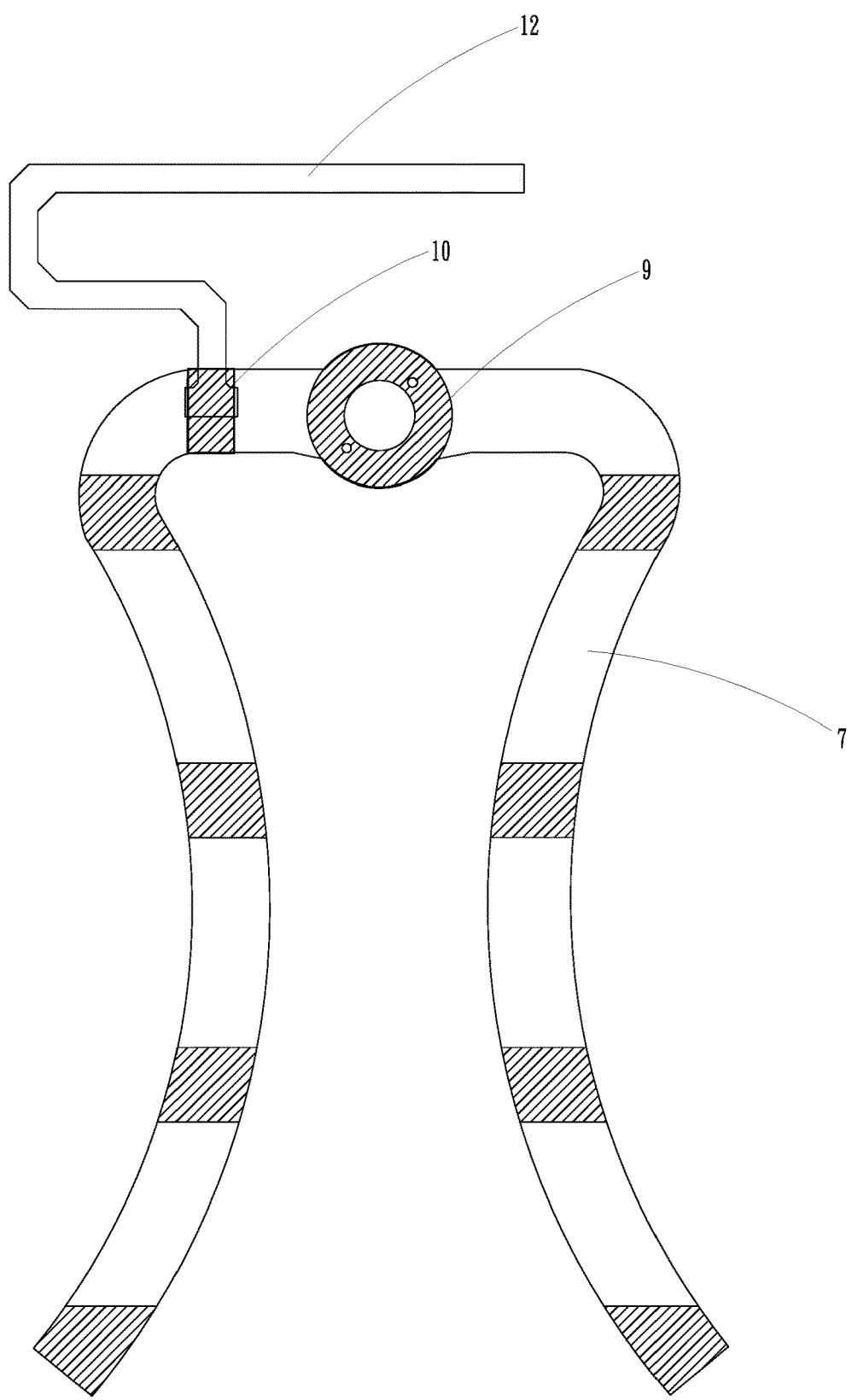
FIG. 4 is a schematic view showing the backside of a flexible printed circuit component.

With reference to FIGS. 1 to 7 for a pet chest strap with a mount in accordance with a preferred embodiment of the present invention, the pet chest strap comprises: a chest strap body 1 and a hardware holder 2 fixed and locked to the chest strap body 1, characterized in that the hardware holder 2 has a locking assembly thereon and a connecting terminal child-and-mother seat therein; the chest strap body 1 includes a flexible printed circuit component 6; the flexible printed circuit component 6 has a plurality of LED luminous bodies 4 attached thereon and packaged by a resin; the LED luminous bodies 4 are coupled to the connecting terminal child-and-mother seat of the hardware holder 2 through the flexible printed circuit component 6; the flexible printed circuit component 6 includes a U-shaped flexible substrate 7, and a flexible n-shaped antenna 12, and the U-shaped flexible substrate 7 and the flexible n-shaped antenna 12 are coupled altogether, and the of the U-shaped flexible substrate 7 has a round hole 8 formed thereon, and the round hole 8 is used as the center for attaching a ring shaped structural reinforcing plate 9 made of a hard material around the round hole 8 and an LED positive electrode circuit contact, an LED negative electrode circuit contact, an antenna contact, and a grounding contact are disposed around the round hole by using the round hole as the center; and the electrically conductive metal layer is comprised of a plurality of non-contact sections, and one of the non-contact sections is coupled to the LED positive electrode circuit contact, and one of the non-contact sections is coupled to the LED negative electrode contact, and one of the non-contact sections is coupled to the n-shaped antenna 12 and the antenna contact, and one of the non-contact sections is coupled to the grounding contact. The bottom of the hardware holder 2 has a honeycomb reinforced structure. The LED luminous body 4 is a monochromatic lamp bead. The ring shaped structural reinforcing plate 9 has a mating hole formed thereon and provided and provided for connection. The flexible printed circuit component 6 has a structural reinforcing plate 10 installed at the position of the LED luminous body 4 and the backside of the connecting position of the U-shaped flexible substrate 7 and the flexible n-shaped antenna 12, and the structural reinforcing plate 10 is provided for preventing the LED luminous body 4, the n-shaped antenna 12, and the U-shaped flexible substrate 7 from falling out or being separated with respect to each other, when the flexible printed circuit component 6 is bent or deformed by an external force.

While the invention has been described by means of specific embodiments, numerous modifications and variations could be made thereto by those skilled in the art without departing from the scope and spirit of the invention set forth in the claims.

What is claimed is:

1. A pet chest strap with a mount, comprising: a chest strap body and a hardware holder, characterized in that the hardware holder is fixed and locked to the chest strap body; the hardware holder has a locking assembly disposed thereon and a connecting terminal child-and-mother seat disposed therein; the chest strap body includes a flexible printed circuit component therein; the flexible printed circuit component has a plurality of LED luminous bodies attached thereon and packaged by a resin; the LED luminous bodies are coupled to the connecting terminal child-and-mother seat of the hardware holder through the flexible printed circuit component; the flexible printed circuit component includes a U-shaped flexible substrate and a flexible n-shaped antenna, the U-shaped flexible substrate and the flexible n-shaped antenna are coupled with each other, and the of the U-shaped flexible substrate has a round hole formed at a U-shaped bending position, and the round hole is used as the center for attaching a ring shaped structural reinforcing plate made of a hard material, and an LED positive electrode circuit contact, an LED negative electrode circuit contact, an antenna contact, and a grounding contact are disposed around the round hole by using the round hole as the center; the electrically conductive metal layer is comprised of a plurality of non-contact sections, and one of the non-contact sections is coupled to the LED positive electrode circuit contact, and one of the non-contact sections is coupled to the LED negative electrode contact, and one of the non-contact sections is coupled to the n-shaped antenna and antenna contact, and one of the non-contact sections is coupled to the grounding contact; the bottom of the hardware holder has a honeycomb reinforced structure; the LED luminous body is a monochromatic lamp bead or a multi-color lamp bead; the ring shaped structural reinforcing plate has a mating hole formed thereon and provided for connection; the flexible printed circuit component has a structural reinforcing plate installed at a position of the LED luminous body and the backside of a connecting position of the U-shaped flexible substrate and the flexible n-shaped antenna, and the structural reinforcing plate is provided for preventing the LED luminous body, the n-shaped antenna, and the flexible printed circuit component from falling out or being separated with respect to each other when the flexible printed circuit component is bent or deformed by an external force.

* * * * *